(12) United States Patent
Seo et al.

(10) Patent No.: US 7,705,366 B2
(45) Date of Patent: Apr. 27, 2010

(54) LED PACKAGE HAVING LEAD FRAMES

(75) Inventors: Jung Hoo Seo, Ansan-si (KR); Suk Jin Kang, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 152 days.

(21) Appl. No.: 12/059,296

(22) Filed: Mar. 31, 2008

(65) Prior Publication Data

US 2009/0224271 A1   Sep. 10, 2009

(30) Foreign Application Priority Data

Mar. 30, 2007   (KR) .................. 10-2007-0032017

(51) Int. Cl.
*H01L 29/22* (2006.01)

(52) U.S. Cl. ............. 257/99; 257/98; 257/100; 257/E33.059; 257/E33.066

(58) Field of Classification Search ............ 257/98, 257/99, 100, E33.059, E33.066
See application file for complete search history.

(56) References Cited

U.S. PATENT DOCUMENTS

| 5,177,593 | A  | * | 1/1993  | Abe ........................... 257/98 |
| 6,841,934 | B2 | * | 1/2005  | Wang et al. ................ 313/512 |
| 7,282,785 | B2 | * | 10/2007 | Yoshida ..................... 257/666 |
| 2008/0023721 | A1 | * | 1/2008 | Lee et al. ..................... 257/99 |
| 2009/0045422 | A1 | * | 2/2009 | Kato et al. ................... 257/98 |

* cited by examiner

*Primary Examiner*—Andy Huynh
(74) *Attorney, Agent, or Firm*—H.C. Park & Associates, PLC

(57) ABSTRACT

The present invention relates a light emitting diode (LED) package. The present invention provides an LED package, wherein one cavity for defining a circumference of an LED chip and other cavities necessary for exposing lead frames are separately formed in a supporting member for supporting lead frames, and the cavity defining the circumference of the LED chip is separately filled with a resin, whereby it is possible to prevent an irregular interface between the resin portions, and when a phosphor is contained in the resin portion formed to be confined in the circumference of the LED chip, it is possible to reduce color deviation for each light directional angle and to prevent unnecessary waste of the phosphor.

9 Claims, 4 Drawing Sheets (a)

(b)

LED PACKAGE HAVING LEAD FRAMES

CROSS REFERENCE TO RELATED APPLICATIONS

This application claims priority from and the benefit of Korean Patent Application No. 10-2007-0032017, filed on Mar. 30, 2007, which is hereby incorporated by reference for all purposes as if fully set forth herein.

BACKGROUND OF THE INVENTION

1. Field of the Invention

The present invention relates to a light emitting diode (LED) package, and more particularly, to an LED package including lead frames on which an LED chip is mounted and a supporting member for supporting the lead frames, wherein the structure of the supporting member, and furthermore, the structure of lead frames are improved.

2. Description of the Related Art

An LED is an element in which electrons or holes are combined in a P-N semiconductor junction structure by application of current thereby emitting certain light. The LED is typically formed to have a package structure, in which an LED chip is mounted, and is frequently referred to as an "LED package." Such an LED package is generally mounted on a printed circuit board (PCB) and receives current applied from electrodes formed on the PCB to thereby emit light.

In an LED package, heat generated from an LED chip has a direct influence on the light emitting performance and life span of the LED package. The reason is that when heat generated from the LED chip remains for a long period of time, dislocation and mismatch occur in a crystal structure of the LED chip.

Accordingly, conventional technologies for promoting dissipation of heat generated from an LED chip have been suggested. A representative of these technologies is an LED package, in which an LED chip is not mounted on a lead frame, but a heat sink slug made of a metallic material with superior thermal conductivity is inserted into a package body and an LED chip is then mounted on the heat sink slug.

However, in the conventional LED package, since the heat sink slug has a volume relatively larger than a heat sink area through which the heat sink slug is exposed to the outside, its use is restricted if the heat sink slug is not made of a expensive thermal conductive material. Further, there is a problem in that much cumbersomeness in a process may occur when mounting the heat sink slug. Furthermore, the heat sink slug may become a cause of hindering compactness of the LED package.

A conventional LED package with a double or multiple molding structure, in which a molding member for protecting an LED chip is formed to have a plurality of resin portions, has been known. The conventional LED package has a single large cavity for opening both portions of first and second lead frames, wherein the portion of the first lead frame has the LED chip mounted thereon, and the portion of the second lead frame is connected to the LED chip by a bonding wire. In such an LED package, a first resin portion made of, for example, silicon resin is first formed in the single cavity, and an epoxy- or silicon-based resin with excellent strength is then formed to cover the entire first resin portion, wherein the first resin portion is strong for thermal impact, and furthermore, contains a phosphor.

However, in the conventional LED package, since the first resin portion is formed by injecting a liquid resin broadly in a large-sized cavity without a clear boundary with the second resin portion to be formed on the first resin portion, the interface between the first and second resin portions is non-uniformly defined, which causes lowering of light efficiency and performance degradation of the LED package due to the lowering of light efficiency. Further, although it is effective that a phosphor used in color mixture of light and color conversion of light due to the color mixture of light is concentrated on a circumference of an LED chip, the phosphor is unnecessarily broadly distributed in the broad cavity. Therefore, the color conversion efficiency of light may be lowered, and furthermore, waste of the phosphor may be caused.

SUMMARY OF THE INVENTION

Accordingly, an object of the present invention is to provide an LED package, wherein one cavity for defining a circumference of an LED chip and other cavities necessary for exposing lead frames are separately formed in a supporting member for supporting lead frames, and the cavity defining the circumference of the LED chip is separately filled with a resin, whereby it is possible to prevent an irregular interface between the resin portions, and when a phosphor is contained in the resin portion formed to be confined in the circumference of the LED chip, it is possible to reduce color deviation for each light directional angle and to prevent unnecessary waste of the phosphor.

Another object of the present invention is to provide an LED package, wherein separate cavities filled with different resin portions are formed in a supporting member for supporting lead frames and heat can be easily dissipated by the lead frames and the supporting member without a heat sink slug.

According to an aspect of the present invention, there is provided an LED package, which comprises first and second lead frames disposed to be spaced apart from each other; an LED chip mounted on the first lead frame and connected to the second lead frame by a bonding wire; a supporting member formed to support the first and second lead frames, the supporting member defining first and second cavities divided from each other, the first cavity being formed on the first lead frame having the LED chip positioned thereon, the second cavity being formed on the second lead frame having one end of the bonding wire positioned thereon; and a molding member including a first resin portion filled in the first cavity to cover the LED chip and a second resin portion covering the first resin portion while a portion of the second resin is filled in the second cavity.

At this time, preferably, a third cavity for mounting a zener diode is further formed in the supporting member, and a portion of the second resin portion is filled in the third cavity. In addition, the supporting member may further comprise a cup portion formed to define a circumference of the second resin portion.

Further, preferably, the first resin portion is made of a silicon resin as a main component and contains a phosphor, and the second resin portion is made of a silicon or epoxy resin.

Furthermore, preferably, the first and second lead frames formed at adjacent positions respectively have depressed portions to define a cup sectional portion, and the first and second cavities are positioned on the cup sectional portion. In addition, the supporting member is preferably formed to cover portions of the first and second lead frames, excluding a bottom surface of the cup sectional portion of the first and second lead frames. Also, preferably, the first and second lead frames have outer leads connected external electrodes outside of the supporting member, respectively, and each of the outer leads is bent to be positioned flush with the bottom surface of the supporting member.

DETAILED DESCRIPTION OF THE INVENTION

Hereinafter, exemplary embodiments of the present invention will be described in detail with reference to the accompanying drawings.

Embodiment

Figure 1:
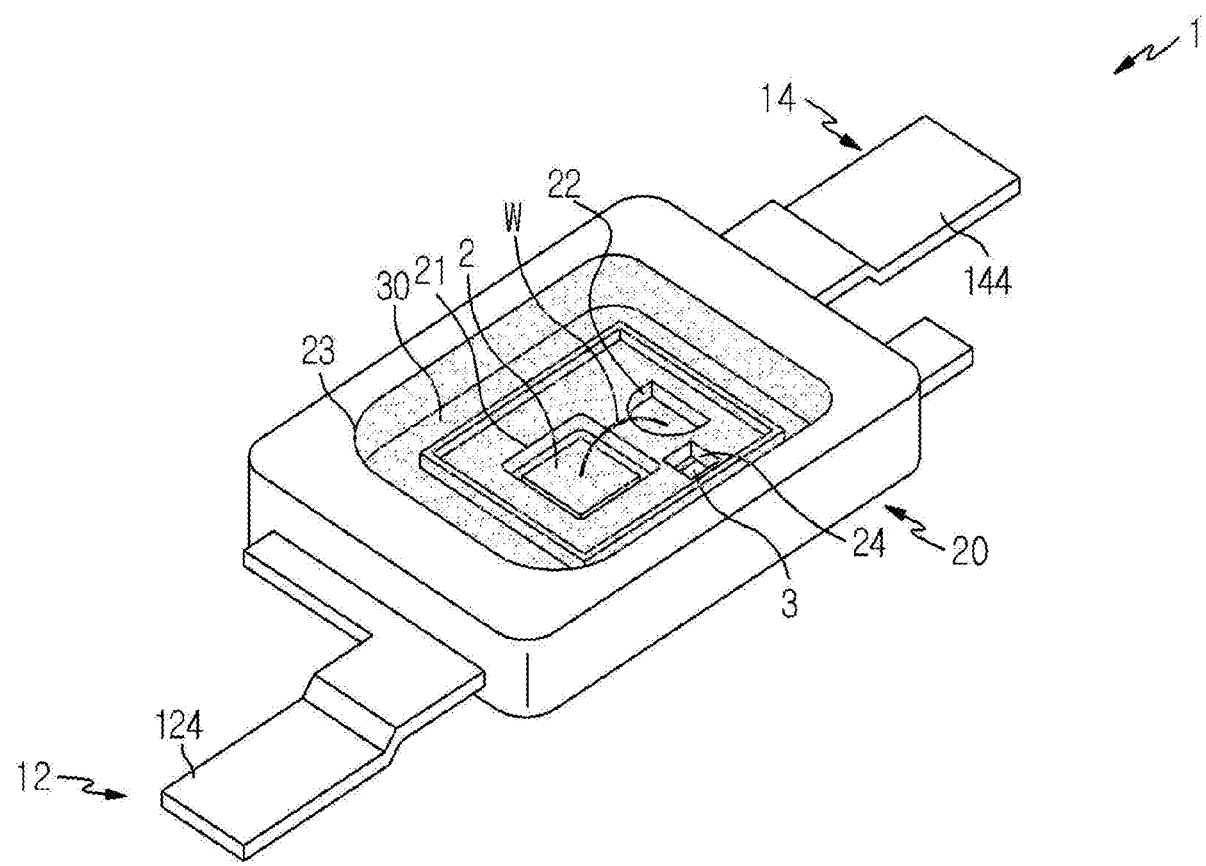
FIG. 1 is a perspective view showing an LED package according to an embodiment of the present invention.
Figure 2:
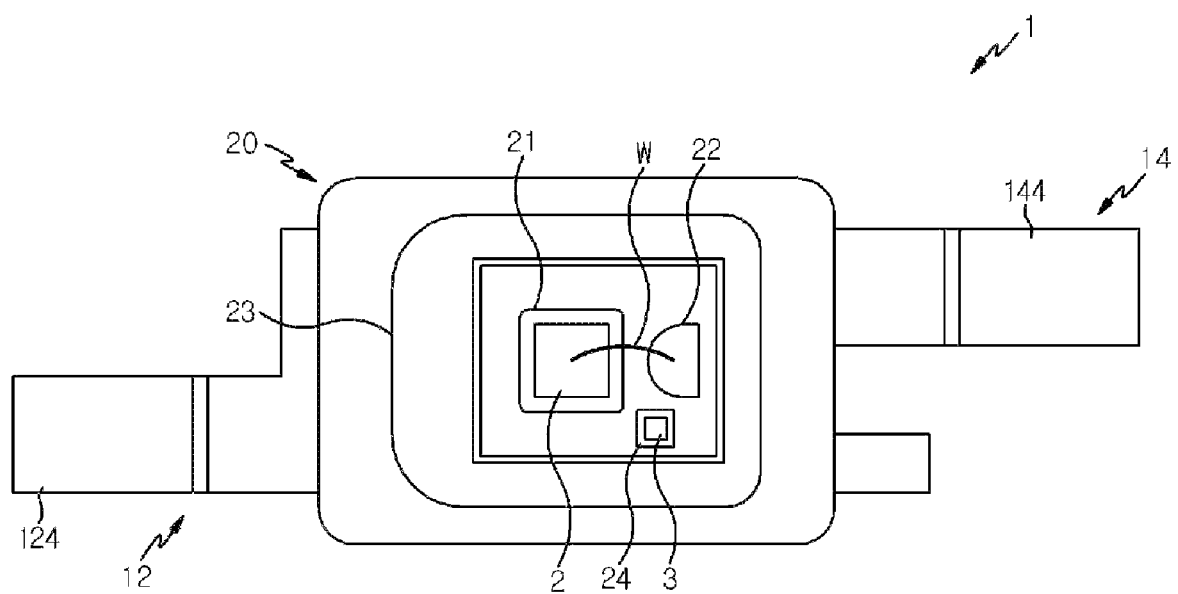
FIG. 2 is a plan view showing the LED package according to the embodiment of the present invention from which a molding member is removed.
Figure 3:
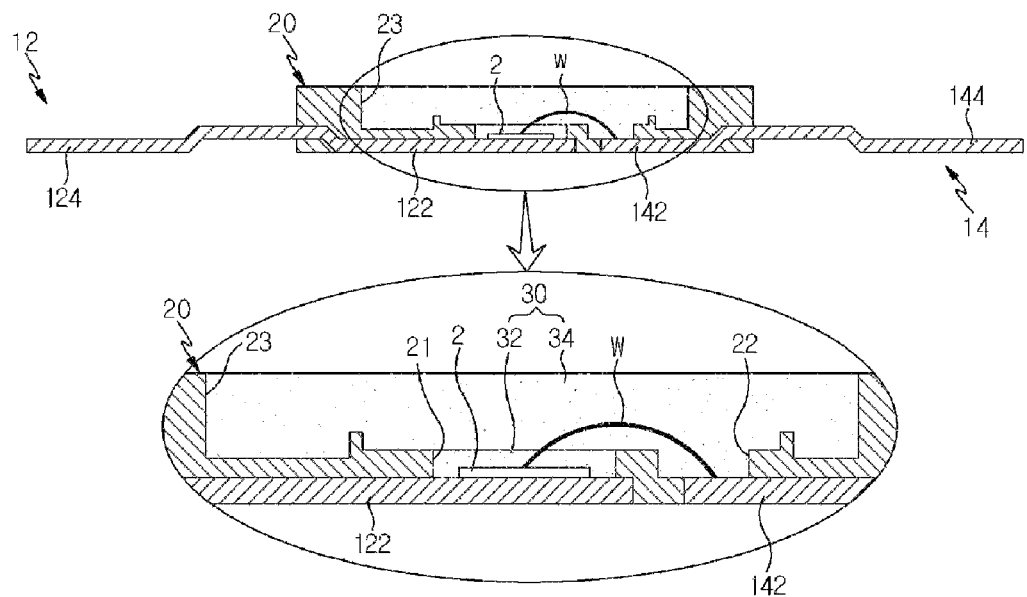
FIG. 3 is a sectional view of the LED package according to the embodiment of the present invention.
Figure 4:
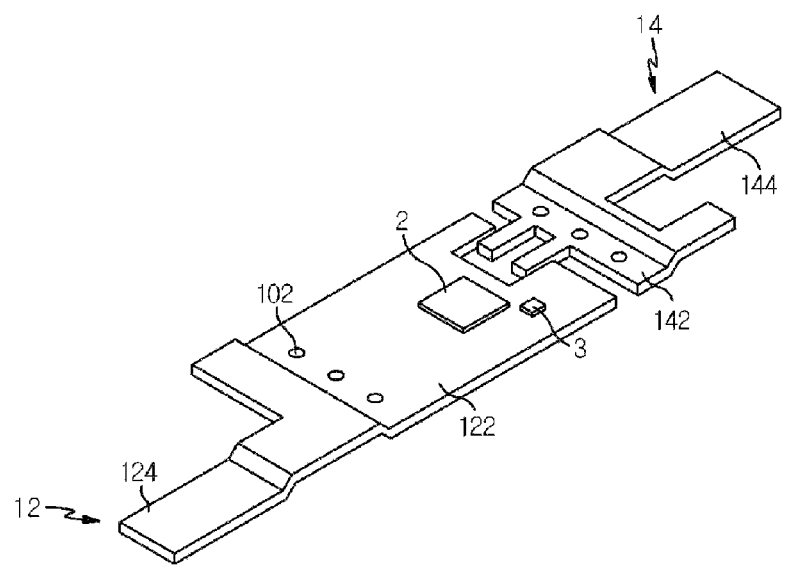
FIG. 4 is a perspective view illustrating the configuration of a lead frame according to the embodiment of the present invention.

FIG. 1 is a perspective view showing an LED package according to an embodiment of the present invention; FIG. 2 is a plan view showing the LED package according to the embodiment of the present invention from which a molding member is removed; FIG. 3 is a sectional view of the LED package according to the embodiment of the present invention; FIG. 4 is a perspective view illustrating the configuration of a lead frame according to the embodiment of the present invention.

Referring to FIGS. 1 to 3, an LED package 1 of this embodiment comprises an LED chip 2; first and second lead frames 12 and 14 for applying current to the LED chip 2; a member 20 for supporting the first and second lead frames 12 and 14 (hereinafter, referred to as a "supporting member"); and a transparent molding member 30 (shown in FIGS. 1 and 3) formed to protect the LED chip 2.

Referring to FIGS. 3 and 4, each of the first and second lead frames 12 and 14 has the shape of a long plate made of a metallic material. The first and second lead frames 12 and 14 are spaced apart from each other while being supported by the supporting member 20. Depressed portions 122 and 142 opened toward each other are formed at adjacent ends of the first and second lead frames 12 and 14, for example, by a bending process. The depressed portions 122 and 142 define a concave cup sectional portion therein, and first and second cavities 21 and 22 of the supporting member 20, which will be described later, are positioned on the cup sectional portion.

The LED chip 2 is mounted on a top surface of the depressed portion 122 of the first lead frame 12, and one end of a bonding wire W extending from the LED chip 2 is connected to a top surface of the depressed portion 142 of the second lead frame 14. In addition, the supporting member 20 is formed by molding a synthetic resin so that the supporting member 20 covers portions of the first and second lead frames 12 and 14 excluding a bottom surface of the cup sectional portion defined by the depressed portions 122 and 142. Thus, bottom surfaces of the depressed portions 122 and 142, i.e., the bottom surface of the cup sectional portion, are exposed to the outside of the supporting member 20. At this time, the bottom surfaces are preferably positioned approximately flush with the bottom surface of the supporting member 20. Since the respective depressed portions 122 and 124 of the first and second lead frames 12 and 14 are exposed to the outside while having thin thickness and broad area, the first and second lead frames 12 and 14 can largely contribute to dissipation of heat from the LED chip 2 to the outside. Accordingly, it is possible to omit a heat sink slug with a complicated structure, which is required in a conventional LED package.

In addition, the first and second lead frames 12 and 14 have outer leads 124 and 144 formed to extend and be bent to the lateral outside of the supporting member 20 from the depressed portions 122 and 142, respectively. The outer leads 124 and 144 are connected to external electrodes (not shown) on a PCB on which the LED package is mounted. In order to be easily connected to the external electrodes, the outer leads 124 and 144 are bent to be positioned approximately flush with the bottom surface of the supporting member 20.

As shown in the enlarged view of FIG. 3, the supporting member 20 has first and second cavities 21 and 22 respectively corresponding to the depressed portions 122 and 142 of the first and second lead frames 12 and 14. At this time, each of the first and second cavities 21 and 22 has a sufficient height due to the depressed depth of the depressed portions 122 and 142. The first cavity 21, which is a space for defining a circumference of the LED chip 2, is filled with a first resin portion 32 made of a silicon resin having a phosphor contained therein. Meanwhile, the second cavity 22 defines a circumference of a contact region, to which the one end of the bonding wire W is connected, and is filled with a second resin portion 34 made of an epoxy or silicon resin with high strength. At this time, the first cavity 21 is first filled with the first resin portion 32, and the second cavity 22 is then filled with the second resin portion 34.

The second resin portion 34 is formed so that the second cavity 22 is partially filled with the second resin portion 34 and then the second resin portion 34 entirely covers the first resin portion 32 with which the first cavity 21 is previously filled. The supporting member 20 has a cup portion 23 having a sufficient height and surrounding both the first and second cavities 21 and 22, and the cup portion 23 defines a circumference of the second resin portion 34 formed on the first resin portion 32 after filling the second cavity 22. As described above, through the configuration of the supporting member 20 in which the first cavity 21 is separately formed in the circumference of the LED chip 2, an interface with a roughly uniform height can be obtained between the first and second resin portions 32 and 34. In addition, the first resin portion 32 containing a phosphor is formed in the first cavity 21 confined in the circumference of the LED chip 2, thereby preventing degradation of color conversion efficiency of light and/or waste of phosphor.

Referring to FIGS. 1 and 2, in addition to the first and second cavities 21 and 22, a third cavity 24 is further formed in the supporting member 20. The third cavity 24 defines a space in which a zener diode 3 for protecting a driving circuit of the LED chip from an instantaneous over-voltage is mounted on the first lead frame 12. According to the embodiment of the present invention, the third cavity 24 to protect the zener diode 3 is partially filled with the aforementioned second resin portion 34.

Additionally, referring to FIG. 4, a plurality of fixing holes 102 is bored through the first and second lead frames 12 and 14. When the supporting member 20 (see FIGS. 1 to 3) is molded of liquid resin, the plurality of fixing holes 102 define spaces allowing the liquid resin to be filled up and cured. Thus, portions of the supporting member 20 may pass through the fixing holes 102 for connection, so that the first and second lead frames 12 and 14 can be fixedly supported by the supporting member 20.

Figure 5:
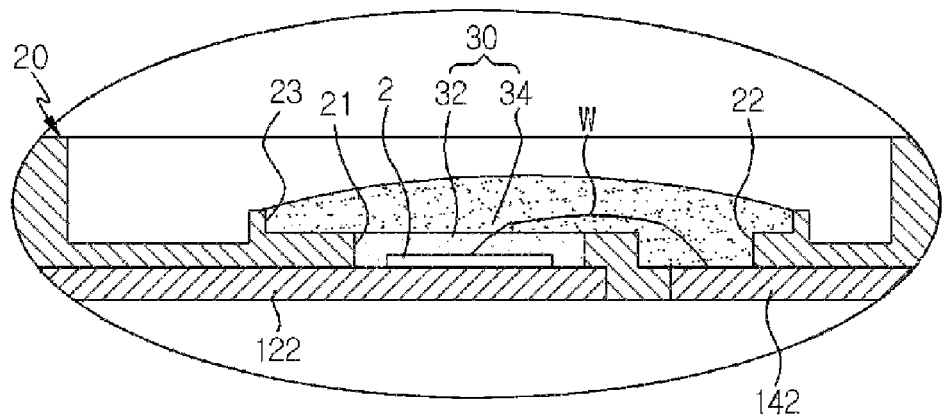
FIGS. 5(a) and 5(b) are enlarged views partially showing an LED package in which a molding member is modified according to another embodiment of the present invention.
Figure 5:
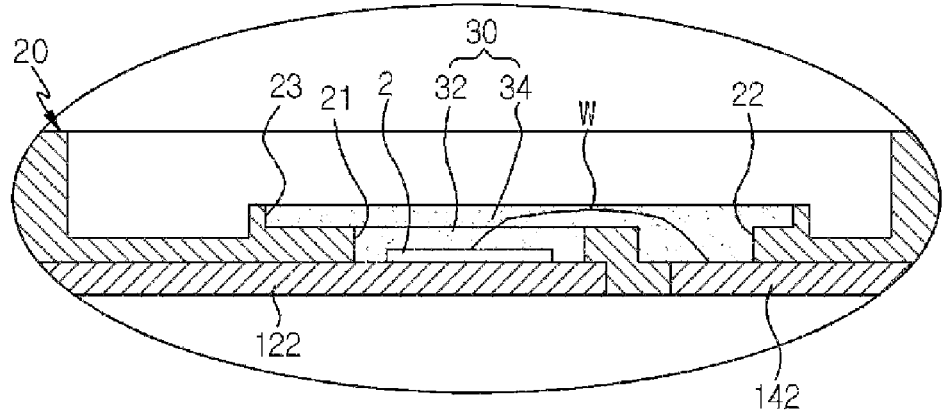

FIGS. 5(a) and (b) are enlarged views partially showing an LED package in which the configuration of a molding member 30 is modified according to another embodiment of the present invention. Referring to FIGS. 5(a) and (b), a supporting member 20 has a cup portion 23 positioned lower than the cup portion of the previous embodiment, and a second resin portion 34 is formed in a lens or plane shape in the cup portion 23. Although not shown, it will be apparent that another resin is further provided on the second resin portion 34.

According to the present invention, a cavity for defining a circumference of an LED chip is separately formed, so that the interface between one resin portion containing a phosphor, with which the cavity is filled, and another resin portion covering the top of the one resin portion has an almost uniform height. Accordingly, it is possible to enhance the light efficiency of an LED package. In addition, when a phosphor is contained in the resin portion formed to be confined in the circumference of the LED chip, it is possible to reduce color deviation for each light directional angle and to prevent unnecessary waste of the phosphor.

Further, according to the present invention, the area through which first and second lead frames are exposed to the outside is largely increased, thereby improving heat dissipation property of the LED package. Accordingly, performance degradation of the LED package can be prevented and life span of the LED package can be extended. In addition, an LED package according to an embodiment of the present invention can have sufficient heat dissipation performance without mounting of a heat sink slug that is structurally and economically inefficient.

Although the present invention have been described with a specified embodiment, it will be apparent to those skilled in the art that various modifications, changes and variations can be made thereto within the scope of the present invention and the appended claims. Therefore, the aforementioned descriptions and the accompanying drawings should be construed as not limiting the technical spirit of the present invention but illustrating the present invention.

What is claimed is:

1. A light emitting diode (LED) package, comprising:
   first and second lead frames disposed to be spaced apart from each other;
   an LED chip mounted on the first lead frame and connected to the second lead frame by a bonding wire;
   a supporting member formed to support the first and second lead frames, the supporting member defining first and second cavities divided from each other, the first cavity being formed on the first lead frame having the LED chip positioned thereon, the second cavity being formed on the second lead frame having one end of the bonding wire positioned thereon; and
   a molding member including a first resin portion filled in the first cavity to cover the LED chip and a second resin portion covering the first resin portion while a portion of the second resin is filled in the second cavity.

2. The LED package as claimed in claim 1, wherein a third cavity for mounting a zener diode is further formed in the supporting member, and a portion of the second resin portion is filled in the third cavity.

3. The LED package as claimed in claim 1, wherein the supporting member further comprises a cup portion formed to define a circumference of the second resin portion.

4. The LED package as claimed in claim 1, wherein the first resin portion is made of a silicon resin as a main component and contains a phosphor.

5. The LED package as claimed in claim 1, wherein the second resin portion is made of a silicon or epoxy resin.

6. The LED package as claimed in claim 1, wherein the first and second lead frames formed at adjacent positions respectively have depressed portions to define a cup sectional portion, and the first and second cavities are positioned on the cup sectional portion.

7. The LED package as claimed in claim 6, wherein the supporting member is formed to cover portions of the first and second lead frames, excluding a bottom surface of the cup sectional portion of the first and second lead frames.

8. The LED package as claimed in claim 1, wherein the first and second lead frames have outer leads connected external electrodes outside of the supporting member, respectively, and each of the outer leads is bent to be positioned flush with the bottom surface of the supporting member.

9. The LED package as claimed in claim 2, wherein the supporting member further comprises a cup portion formed to define a circumference of the second resin portion.

* * * * *